United States Patent [19]

Takehara

[11] Patent Number: 4,831,342
[45] Date of Patent: May 16, 1989

[54] VARIABLE FREQUENCY MULTIVIBRATOR

[75] Inventor: Shigeru Takehara, Chandler, Ariz.

[73] Assignee: Motorola, Inc., Schaumburg, Ill.

[21] Appl. No.: 185,623

[22] Filed: Apr. 25, 1988

[51] Int. Cl.⁴ ............................................. H03K 3/282
[52] U.S. Cl. .................................. 331/113 R; 331/144
[58] Field of Search ..................... 331/113 R, 144, 145

[56] References Cited

U.S. PATENT DOCUMENTS 3,688,213  8/1972  Calaway ...................... 331/113 R X
3,857,110  12/1974  Grebene ...................... 331/113 R X Primary Examiner—Siegfried H. Grimm
Attorney, Agent, or Firm—Michael D. Bingham

[57] ABSTRACT

A variable frequency multivibrator circuit comprises first and second switching transistors having emitters coupled across a timing capacitor. First and second feedback circuits provide positive feedback to the first and second switching transistors whenever the first or second switching transistors are on. A control current controls the frequency of the multivibrator circuit and is independent of the feedback current. Additional drive is provided to the first and second switching transistors during their transitions from an off to an on state.

6 Claims, 2 Drawing Sheets

VARIABLE FREQUENCY MULTIVIBRATOR

BACKGROUND OF THE INVENTION

This invention relates generally to an emitter coupled multivibrator, and more particularly to a variable frequency multivibrator circuit configured so as to render the oscillation swing substantially independent of the charge/discharge current flowing through the circuit's timing capacitor.

Emitter-coupled multivibrator circuits are a subclass of constant-current charge/discharge oscillators and are known to have several performance advantages. First, since such circuits generally comprise all NPN components, they are capable of high-frequency operation (i.e. 10 megahertz). Second, these circuits are symmetrical producing symmetrical output waveforms which have low even-harmonic content provided the two halves of the circuit are matched. Third, substantially linear control of frequency may be obtained by means of a control current or voltage. A more detailed discussion of emitter-coupled multivibrator circuits can be found in *Bipolar and MOS Analog Integrated Circuit Design* by Allen B. Grebene (1984, John Wiley and Sons, Inc.).

In an elementary variable frequency emitter-coupled multivibrator, the output frequency $F_O$ may be thought of as $$F_O = I_x / (2 \cdot C \cdot V_p)$$

where C is the capacitance of the timing capacitor, $V_p$ is the voltage across the capacitor, and $I_x$ is a control current. Thus, the frequency $F_O$ may be varied by varying $I_x$; however, a linear conversion of $I_x$ to $F_O$ would require that $V_p$ be kept constant.

One known approach for achieving a constant $V_p$ is through the use of clamping diodes. This circuit, however, is unsatisfactory since the output frequency is inversely proportional to $V_{be}$ (the base-emitter voltage drop of the transistor) resulting in a frequency having a strong positive temperature coefficient since $V_{be}$ varies at a rate of about $-2$ mV/degree.

A second approach to achieving a constant $V_p$ utilizes a current subtraction scheme to be more fully described herein below. In this approach, large resistors are used to provide good positive feedback; however, such resistors cause variations in $V_p$. Furthermore, such resistors are temperature and process dependent which degrades the linearity of $F_O$ with respect to $I_x$. Finally, the control current $I_x$ is related to the current in the feedback portion of the circuit which is in turn affected by variations in the resistors.

SUMMARY OF THE INVENTION

It is an object of the present invention to provide an improved variable frequency multivibrator.

It is a further object of the present invention to provide an improved variable frequency multivibrator which enhances the linearity of the output frequency with respect to a control current.

It is a still further object of the present invention to provide a variable frequency multivibrator wherein a feedback path is enabled only during transition periods.

Yet another object of the present invention is to provide a variable frequency multivibrator wherein unwanted voltage variations across the timing capacitor are minimized.

A still further object of the present invention is to provide a variable frequency multivibrator wherein the control current is independent of current in the feedback portion of the circuit.

According to a broad aspect of the invention there is provided a variable frequency multivibrator circuit, comprising a timing capacitor having first and second terminals, a first switching transistor capable of transitioning between on and off states, the first switching transistor having an emitter terminal coupled to the first terminal of the timing capacitor, and having base and collector terminals. A second switching transistor capable of a transitioning between on and off states has an emitter terminal coupled to the second terminal of the timing capacitor and has base and collector terminals A first current source is coupled between the emitter terminal of the first switching transistor and a first power supply terminal A second current source is coupled between the emitter terminal of the second switching transistor and the first power supply terminal. A first feedback circuit is coupled to the base and collector terminals of the first switching transistor for providing positive feedback thereto when the first switching transistor is on, and a second feedback circuit is coupled to the base and collector terminals of the second transistor for providing positive feedback thereto when the second switching transistor is on. A third current source is coupled between the first and second feedback circuits and the first power supply terminal, the current flowing in the first and second current sources being independent of the current flowing in the third current source.

The above and other objects, features and advantages of the present invention will be more clearly understood from the following detailed description taken in conjunction with the accompanying drawings, in which:

DESCRIPTION OF THE PREFERRED EMBODIMENT

Figure 1:
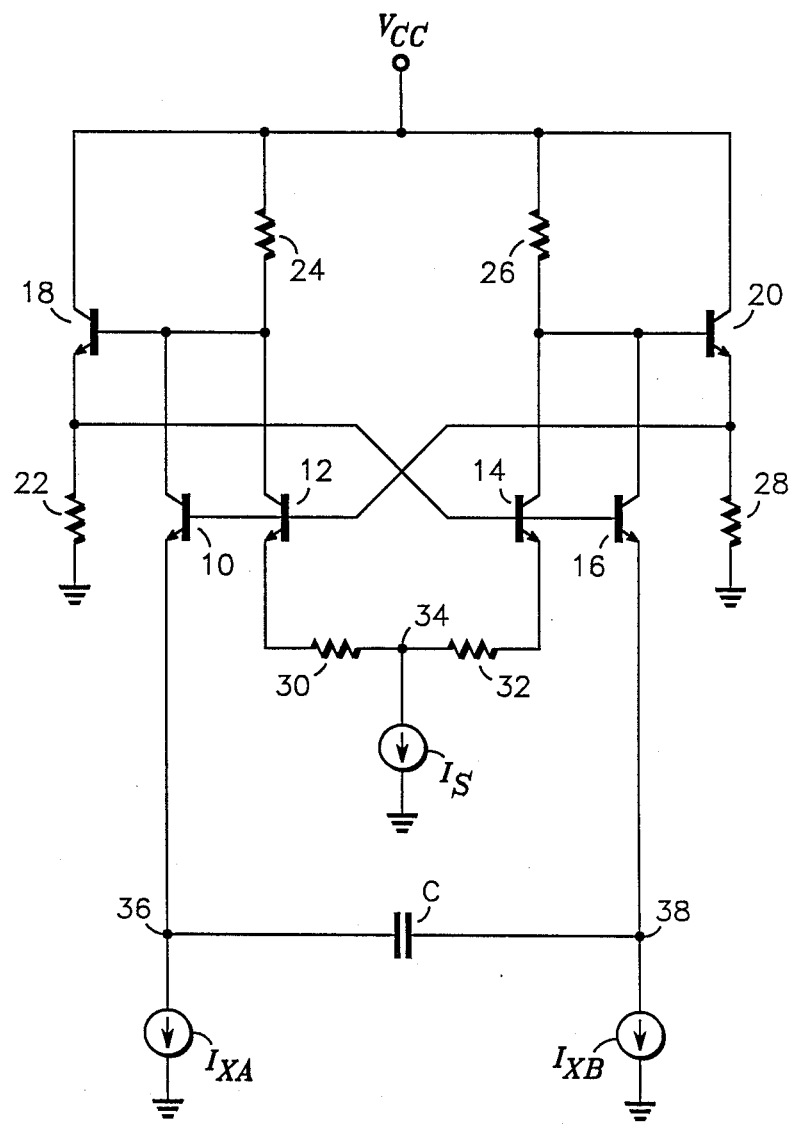
FIG. 1 is a schematic diagram of a known variable frequency multivibrator circuit.

FIG. 1 is a schematic diagram of a prior art variable frequency multivibrator. It comprises NPN transistors 10, 12, 14, 16, 18 and 20, bias resistors 22, 24, 26 and 28, heavy duty resistors 30 and 32, timing capacitor C, and current sources $I_S$, $I_{xa}$, and $I_{xb}$ where $I_{xa}$ is substantially equal to $I_{xb}$. The base terminals of transistors 10 and 12 are coupled to the emitter of transistor 20 which is in turn coupled via resistor 28 to a source of supply voltage (e.g. ground). Similarly, the base terminals of transistor 14 and 16 are coupled to the emitter terminal of NPN transistor 18 which is in turn coupled to a source of supply voltage (e.g. ground) via resistor 22. The collectors of transistors 18 and 20 are coupled respectively to a second source of supply voltage ($V_{cc}$).

The collector electrodes of transistors 12 and 14 are coupled to $V_{cc}$ via resistors 24 and 26 respectively and to the base terminals of transistors 18 and 20 respectively. The collector terminals of transistors 10 and 16 are coupled respectively to the base terminals of transistors 18 and 20.

The emitter of transistor 12 is coupled via heavy duty resistor 30 to node 34 which is in turn coupled to ground through current source $I_s$. A second heavy duty resistor 32 is coupled between the emitter of transistor 14 and node 34. The circuit's timing capacitor C is coupled between nodes 36 and 38 at the emitters of transistors 10 and 16. Node 36 is in turn coupled to ground through current source $I_{xa}$, and node 38 is coupled to ground through current source $I_{xb}$.

The variable frequency multivibrator circuit shown in FIG. 1 attempts to keep the voltage $V_p$ (the voltage across timing capacitor C) constant by making the tail current or feedback current (Is) equal to the supply current (flowing through either resistor 24 or 26) less $I_{xa}$ or $I_{xb}$ depending on which side of the circuit is turned on. The circuit operates as follows. Assume first that a transition has just taken place and transistor 10 is off and transistor 16 is on. $I_{xa}$ flows through capacitor C causing capacitor C to be charged. When the voltage across capacitor C reaches $V_p$ the next circuit transition begins. That is, transistor 10 begins to conduct and transistor 16 begins to turn off. The voltage therefore at the base of transistor 18 falls making its emitter voltage low. This in turn maintains transistor 14 in an off state keeping the voltage at the base of transistor 20 high. In this manner, a high voltage is applied to the base terminals of transistors 10 and 12 thus accelerating the transition of transistor 20 from the off to the full on state.

$I_{xb}$ flows through capacitor C causing it to charge in an opposite direction. As capacitor C charges, transistor 16 will begin to turn on and transistor 10 will begin to turn off. As transistor 16 turns on, the voltage at the base of transistor 20 will fall keeping transistor 20 off thus maintaining transistor 12 in an off condition. Since the voltage at the base of transistor 18 will be high, transistor 18 will turn on applying base drive to transistor 16 thus accelerating its transition from the off to the on state. By varying $I_{xa}$ ($I_{xb}$), the transition frequency of the circuit may be varied in accordance with the expression given above.

Figure 2:
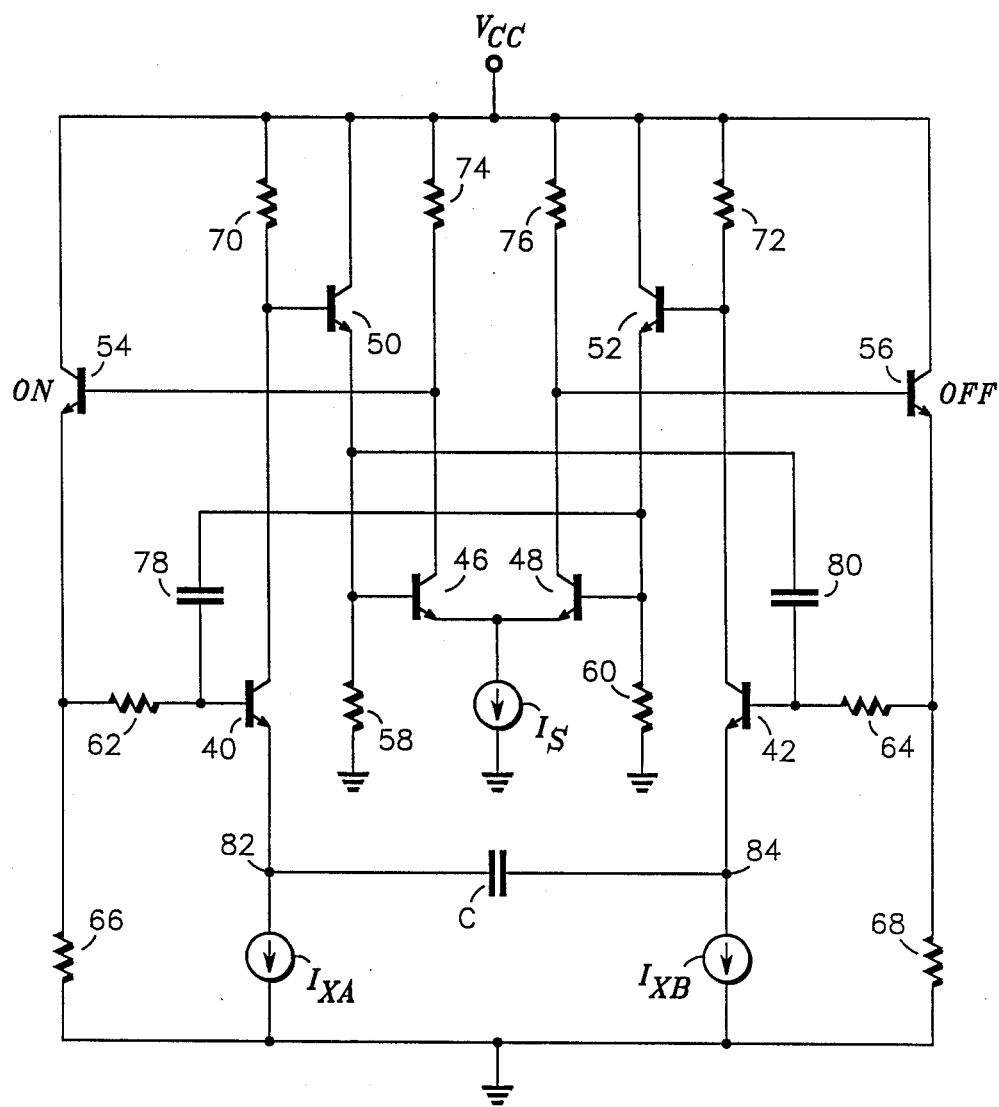
FIG. 2 is a schematic diagram of the inventive variable frequency multivibrator circuit.

As can be seen, the positive feedback greatly increases the circuit's transition time thus achieving greater linearity for high frequency oscillation; however, it is necessary that the feedback path be always active during transition. Unfortunately, heavy duty resistors 30 and 32 are required since without them, the transition time would be too sharp thus reducing the positive effects of the feedback. That is, a small change in emitter current at the beginning of a transition does not trigger the positive feedback since the differential pair (transistors 12 and 14) have a sharp input voltage window during which the differential pair is in linear operation. These resistors, on the other hand, result in additional problems. While they assure a good feedback path, they can modify $V_p$. Furthermore, these resistors are temperature/process dependent. It should also be noted that in the circuit shown in FIG. 1, the feedback path is active even during the quiescent state of the circuit. Thus, $I_s$ is always flowing enhancing the problems associated with resistors 30 and 32. Finally, since $I_s$ and $I_{xa}$ ($I_{xb}$) are related, any variations in their relationship will degrade the linearity of the circuit FIG. 2 is a schematic diagram of the inventive variable frequency multivibrator circuit. It comprises NPN transistors 40, 42, 46, 48, 50, 52, 54, and 56, resistors 58, 60, 62, 64, 66, 68, 70, 72, 74 and 76, capacitors 78 and 80, timing capacitor C and current sources $I_s$, $I_{xa}$ and $I_{xb}$.

The emitter of transistors 46 and 48 are coupled via current source $I_s$ to a source of supply (e.g. ground). The collector terminals of transistors 46 and 48 are coupled respectively to the base electrodes of transistors 54 and 56 and to a second source of supply voltage ($V_{cc}$) via respectively resistors 74 and 76. The base electrode of transistor 46 is coupled to ground via resistor 58, to one terminal of AC coupling capacitor 80, and to the emitter of transistor 50. The base of transistor 48 is coupled to ground via resistor 60, to one terminal of AC coupling capacitor 78, and to the emitter of transistor 52. The collectors of transistors 50 and 52 are coupled to a second source of supply ($V_{cc}$), and the base electrodes of transistors 50 and 52 are coupled to $V_{cc}$ via resistors 70 and 72 respectively.

Transistor 54 has a collector coupled to $V_{cc}$ and an emitter coupled via resistor 62 to the base of transistor 40. Transistor 56 has a collector coupled to $V_{cc}$ and an emitter coupled, via resistor 64, to the base of transistor 42. The second terminals of AC coupling capacitors 78 and 80 are coupled respectively to the base terminals of transistors 40 and 42. The emitters of transistors 54 and 56 are also coupled to ground via resistors 66 and 68 respectively.

Transistor 40 has a collector coupled to $V_{cc}$ via resistor 70 and to the base of transistor 50. Transistor 42 has a collector coupled to the base of transistor 52 and, via resistor 72, to $V_{cc}$. The emitters of transistors 40 and 42 are coupled to timing capacitor C (i.e. to nodes 82 and 84 respectively). Finally, current source $I_{xa}$ and $I_{xb}$ are coupled between ground and nodes 82 and 84 respectively.

The inventive circuit operates as follows. Assume first that the circuit is not in transition and that transistor 40 is off and transistor 42 is on. With transistor 40 off, transistor 50 is on causing transistor 46 to be on. However, since capacitor 80 acts as an open circuit at low frequency, the emitter of transistor 50 is not coupled to the base of transistor 42 during the circuit's steady state.

With transistor 46 on, transistor 54 is off causing a low voltage to appear at the base of transistor 40 maintaining transistor 40 in an off state.

Turning to the other half of the circuit, with transistor 42 on, a low voltage is applied to the base of transistor 52 keeping it off. With transistor 52 off, low voltage is applied to the base of transistor 48 maintaining it in an off state. Since transistor 48 is off, a high voltage is applied to the base of transistor 56 turning it on thus providing positive feedback to the base of transistor 42. Again, since the circuit is in its steady state, capacitor 78 acts as an open circuit and therefore the emitter of transistor 52 is not coupled to the base of transistor 40.

As timing capacitor C is charged, transistors 40 and 42 will begin to transition. That is, transistor 40 will begin to turn on and transistor 42 will begin to turn off. When transistor 40 begins to turn on, transistor 50 will start turning off and therefore transistor 46 will begin to turn off. Thus, with the voltage at the base of transistor 54 increasing, transistor 54 will start to turn on providing positive feedback to the base of transistor 40. As transistor 42 turns off, transistor 52 will turn on. This will cause additional base drive to be provided to transistor 40 via AC coupling capacitor 78. When transistor 52 turns on, transistor 48 will turn on causing transistor 56 to turn off. Thus, the positive feedback to the base of transistor 42 which existed while transistor 42 was on is now terminated. As the charge on capacitor 78 increases, transistor 52 will again turn off. The circuit again resumes a steady state condition with capacitors 78 and 80 decoupling transistors 52 and 50 respectively from the base terminals of transistors 40 and 42 respectively. Thus, the boost provided by transistors 50 and 52 to transistors 42 and 40 respectively is present only during transition and not during steady state operation.

One further feature of the circuit shown in FIG. 2 should be noted. That is, current $I_s$ is entirely independent from currents $I_{xa}$ or currents $I_{xb}$. In this manner, circuit linearity is preserved.

The current flowing through transistor 40 will again charge capacitor C until transistor 40 begins to turn off and transistor 42 begins to turn on. In a similar manner as previously described, positive feedback will be provided to the base of transistor 42 by transistor 56 and a boost will be provided to the base of transistor 42 during transition through transistor 50 and capacitor 80.

The above description is given by way of example only. Changes in form and details may be made by one skilled in the art without departing from the scope of the invention as defined by the appended claims.

I claim:

1. A variable frequency multivibrator circuit, comprising:
   a timing capacitor having first and second terminals;
   a first transistor capable of transitioning between on and off states, said first transistor having an emitter terminal coupled to the first terminal of said timing capacitor, and having base and collector terminals;
   a second transistor capable of transitioning between on and off states, said second transistor having an emitter terminal coupled to the second terminal of said timing capacitor and having base and collector terminals;
   a first current source coupled between the emitter terminal of said first transistor and a first power supply terminal;
   a second current source coupled between the emitter terminal of said second transistor and said first power supply terminal;
   a first feedback circuit coupled to the base and collector terminals of said first transistor for providing positive feedback thereto when said first transistor is on;
   a second feedback circuit coupled to the base and collector terminals of said second transistor for providing positive feedback thereto when said second transistor is on; and
   a third current source coupled between said first and second feedback circuits and said first power supply terminal, the current flowing in said first and second current sources being independent of the current flowing in said third current source.

2. The circuit according to claim 1 wherein said first feedback circuit comprises:
   a third transistor having an emitter coupled to said third current source, a collector for coupling to a second power supply terminal and a base;
   a fourth transistor having an emitter coupled to the base of said third transistor and to said first power supply terminal, a collector coupled to said second power supply terminal, and a base coupled to said second power supply terminal and to the collector of said first transistor; and
   a fifth transistor having a base coupled to the collector of said third transistor, a collector coupled to said second power supply terminal and an emitter coupled to the base of said first transistor.

3. A circuit according to claim 2 wherein said second feedback circuit comprises:
   a sixth transistor having an emitter coupled to said third current source, a collector coupled to said second power supply terminal and a base coupled to said first power supply terminal;
   a seventh transistor having an emitter coupled to the base of said sixth transistor and to said first power supply terminal, a collector coupled to said second power supply terminal, and a base coupled to said second power supply terminal and to the collector of said second transistor; and
   an eighth transistor having a base coupled to the collector of said sixth transistor, a collector coupled to said second power supply terminal, and an emitter coupled to the base of said second transistor.

4. A circuit according to claim 3 further comprising:
   first means for providing additional drive to said first transistor when said first transistor is transitioning from an off to an on state; and
   second means for providing additional drive to said second transistor when said second transistor is transitioning from an off to an on state.

5. A circuit according to claim 4 wherein said first means comprises a capacitor having a first terminal coupled to the base of said first transistor and a second terminal coupled to the emitter of said seventh transistor.

6. A circuit according to claim 5 wherein said second means comprises a capacitor having a first terminal coupled to the base of said second transistor and a second terminal coupled to the emitter of said fourth transistor.

* * * * *